US006680857B2

United States Patent
Mueller et al.

(10) Patent No.: US 6,680,857 B2
(45) Date of Patent: Jan. 20, 2004

(54) UNIT-ARCHITECTURE WITH IMPLEMENTED LIMITED BANK-COLUMN-SELECT REPAIRABILITY

(75) Inventors: Gerhard Mueller, Meitingen (DE); Toshiaki Kirihata, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/964,208

(22) Filed: Sep. 26, 2001

(65) Prior Publication Data

US 2003/0058028 A1 Mar. 27, 2003

(51) Int. Cl.[7] .............................................. H01L 27/020
(52) U.S. Cl. ........................ 365/63; 365/200; 257/665; 257/692

(56) References Cited

U.S. PATENT DOCUMENTS

| | | | | | |
|---|---|---|---|---|---|
| 4,630,355 A | * | 12/1986 | Johnson | ......................... | 438/6 |
| 4,704,304 A | * | 11/1987 | Amendola et al. | .......... | 247/600 |
| 4,970,048 A | * | 11/1990 | Noailly | ........................ | 376/439 |
| 5,822,268 A | * | 10/1998 | Kirihata | .................. | 365/230.03 |
| 5,933,725 A | * | 8/1999 | Kirsch et al. | ................ | 438/239 |
| 6,038,191 A | * | 3/2000 | Fukuhara et al. | ............ | 365/229 |
| 6,335,652 B2 | * | 1/2002 | Mueller et al. | .............. | 327/526 |
| 2003/0003606 A1 | * | 1/2003 | Farnworth et al. | ............. | 438/11 |

* cited by examiner

Primary Examiner—Viet Q. Nguyen
(74) Attorney, Agent, or Firm—Slater & Matsil, L.L.P.

(57) ABSTRACT

Multiple conductive paths are provided in a circuit portion between a circuit element and a logic block, enabling repairing of defects in the conductive line coupling the circuit element and logic blocks without the use of fusing.

23 Claims, 5 Drawing Sheets

US 6,680,857 B2

UNIT-ARCHITECTURE WITH IMPLEMENTED LIMITED BANK-COLUMN-SELECT REPAIRABILITY

FIELD OF THE INVENTION

The present invention relates generally to integrated circuits (ICs). More particularly, the invention relates to the repairing of ICs with defective conductive lines.

BACKGROUND OF THE INVENTION

An integrated circuit (IC) comprises a multiplicity of circuit blocks, each containing various circuit components. Conductive lines are provided, interconnecting the circuit components and circuit blocks to perform the desired functions. The conductive lines typically comprise metal and are generally relatively long. As such conductive lines are prone to defects (e.g., open connection) during the manufacturing process. A defective conductive line renders the circuit components or blocks coupled thereto non-accessible, resulting in a non-usable IC.

To address the problem associated with defective conductive lines, additional circuit components (e.g., redundant or spare circuitry) can be provided. FIG. 1 shows a portion 100 of an IC with conventional redundant circuitry. The IC portion includes a plurality of identical circuit blocks $101_{1-x}$. A circuit block comprises a circuit element 110 coupled to, for example, a logic block 120 via a conductive line 130. A spare or redundant circuit block 115, which is essentially identical to circuit blocks 110, is provided. If the conductive line $130_4$ is defective (e.g., open connection 132), then circuit block $101_4$ is replaced with the redundant circuit block using, for example, conventional fuse techniques.

However, such conventional redundancy techniques are ineffective to repair defective bank column select lines (BCLSs) of a hierarchical column select architecture. Referring to FIG. 2, a memory bank 200 of a memory IC is shown. The bank includes a hierarchical column select switch 260 coupled to a plurality of columns 201, each comprising a bitline pair coupled to a sense amplifier (SA). Illustratively, the bank comprises 128 columns. Bank column select lines (BCSLs) and global column select lines (GCSLs) are coupled to the column select switch. The bank column select signals on BCSLs select a group of columns (e.g., 64). The global column select signals on the GCSLs select one column from the selected group of columns for sensing by the secondary sense amplifier 280 coupled to the switch by a master data line (MDQ) 275. If a defect 232 occurs in BCSL $290_0$, a conventional redundant circuit block comprising 64 columns of memory cells, BCSL, and the bank column decoder 281 would be required to repair the defective BCSL. Such a redundant circuit block would require significant chip area, which undesirable increases manufacturing cost As evidenced from the above discussion, it is desirable to provide a technique to effectively repair defective BCSLs.

SUMMARY OF THE INVENTION

The invention relates to improved redundancy in ICs. In one embodiment, the redundancy includes providing multiple conductive paths in a circuit portion between a circuit element and a logic block. Providing multiple conductive paths enables the circuit portion to function properly without the need for fusing to repair a defect in the conductive path. Such a redundancy scheme, in one embodiment, is implemented in a memory system with a hierarchical column select architecture, particular in the BCSL lines.

BRIEF DESCRIPTION OF THE DRAWINGS

FIG. 7, shows a hierarchical column select architecture in accordance with another embodiment of the invention.

PREFERRED EMBODIMENTS OF THE INVENTION

Figure 1:
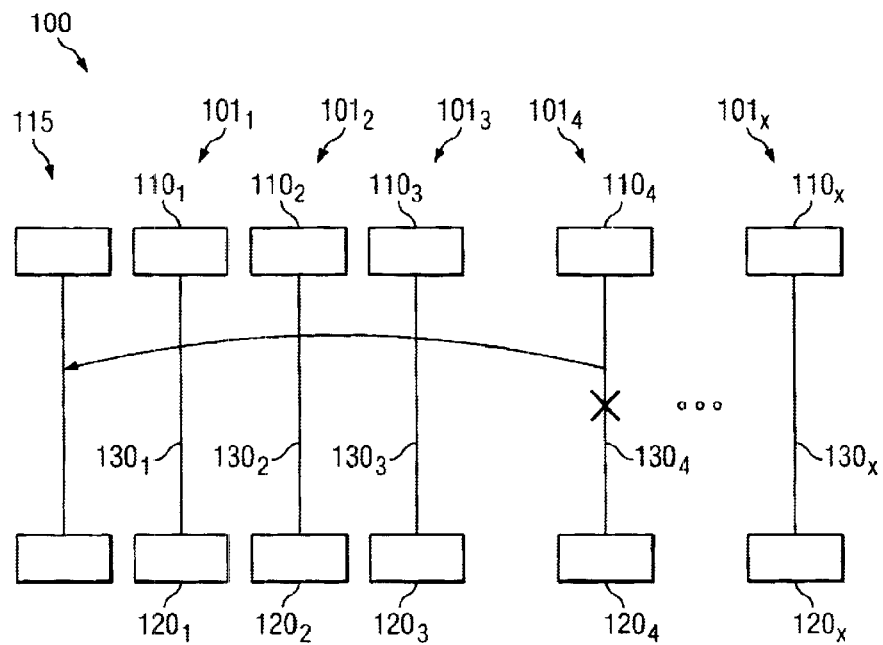
FIG. 1 shows a conventional redundancy technique.
Figure 3:
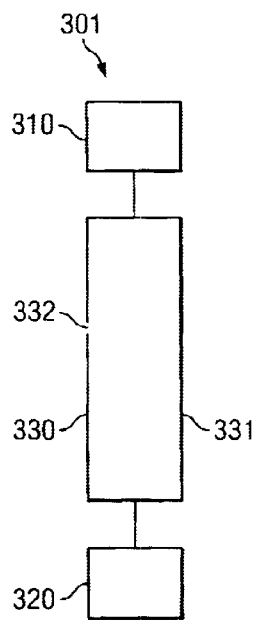
FIGS. 3–4 shows redundancy techniques in accordance with different embodiments of the invention.

FIG. 3 shows an embodiment of the invention for repairing a defective conductive line. The conductive line, for example, comprises a data line such as a bit line, CSL, BCSL, GCSL or MDQ. Other types of conductive lines are also useful. In one embodiment, the conductive line comprises a metallic film such as aluminum, copper, or alloys thereof. Other conductive films are also useful to form the conductive line.

A circuit block 301 comprising first and second elements 310 and 320 is provided. For purposes of discussion, the first element is referred to as a "circuit element" and the second element is referred to as a "logic block". It is understood that circuit element and logic block are intended in the very broad sense and may represent any number of different circuit components.

In accordance with the invention, circuit element 310 and logic block 320 are electrically connected via at least first and second conductive lines 330 and 331. The first and second conductive lines provide redundant electrical paths between the circuit element and the logic block. If one of the conductive lines is defective (e.g., open connection 332 in conductive line 330), the other conductive line (e.g., 331) advantageously maintains the electrical connection between the circuit element and the logic block without the need for redundant circuitry and fuses.

Figure 4:
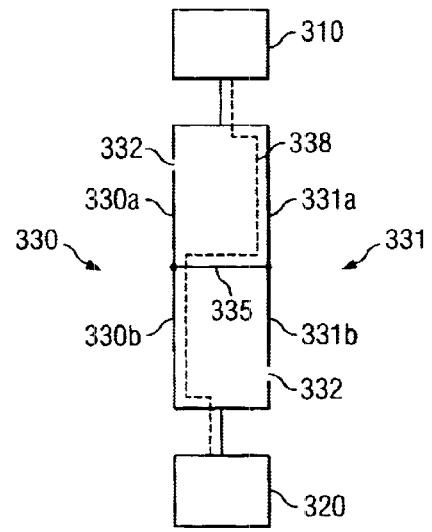
Figure 2:
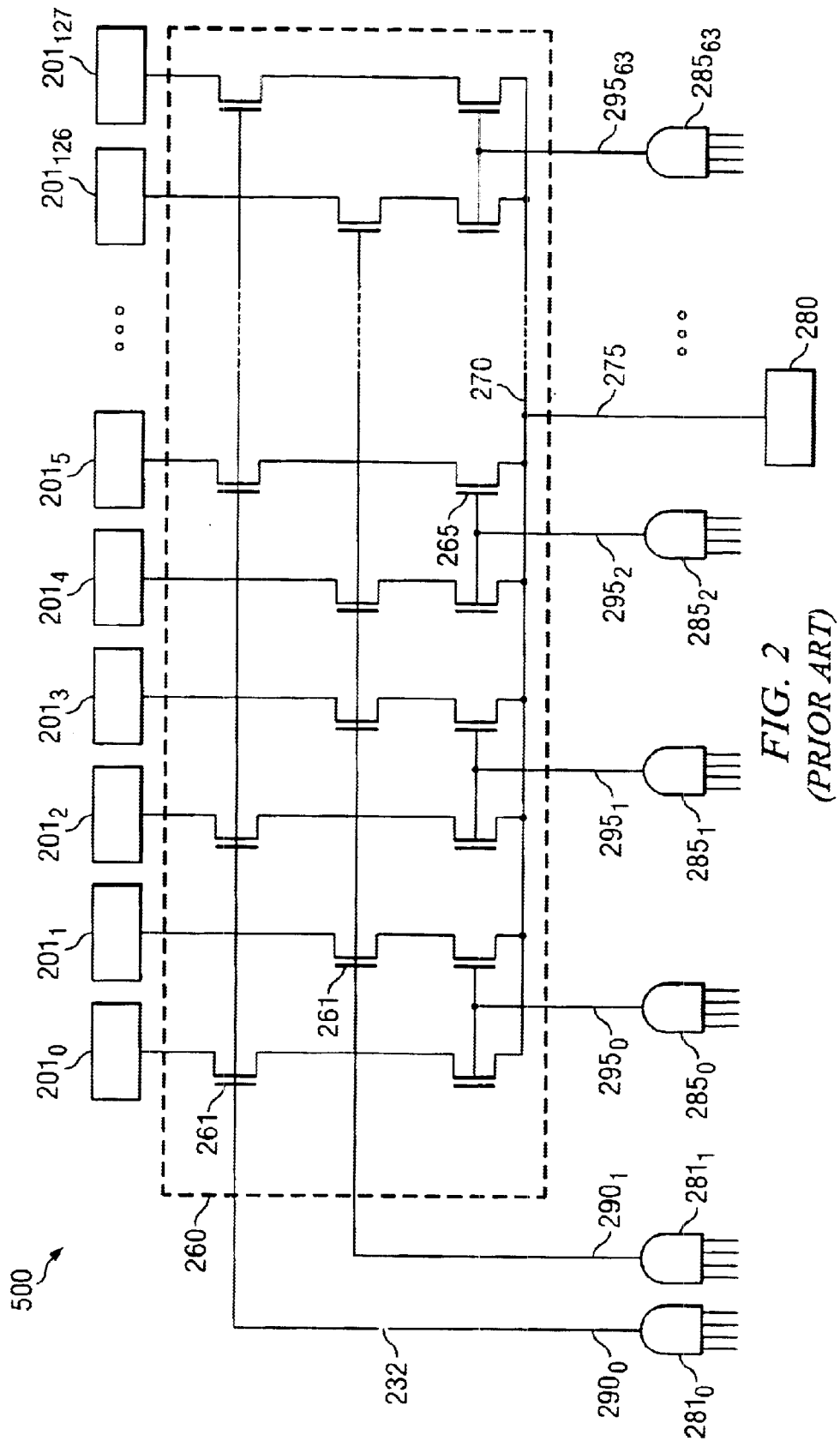
FIG. 2 shows a portion of a memory IC with a hierarchical column select architecture.

FIG. 4 shows an alternative embodiment of the invention. As shown, at least first and second conductive lines 330 and 331 are provided to electrically couple circuit element 310 with logic block 320. In one embodiment, a coupling point 335 is provided to electrically couple the conductive lines together. The coupling point divides each of the conductive lines into first and second segments (denoted by the subscript a and b). The coupling point, in some cases, can advantageously maintain the electrical connection between the circuit element and logic block even when both conductive lines are defective. For example, if the first segment 330a of the first conductive line and the second segment 331b of the second conductive line have open connections 332, then circuit element and logic block are electrically coupled via the path 338 (dotted line). Providing a plurality of coupling points between the first and second conductive lines can also be useful.

Figure 5:
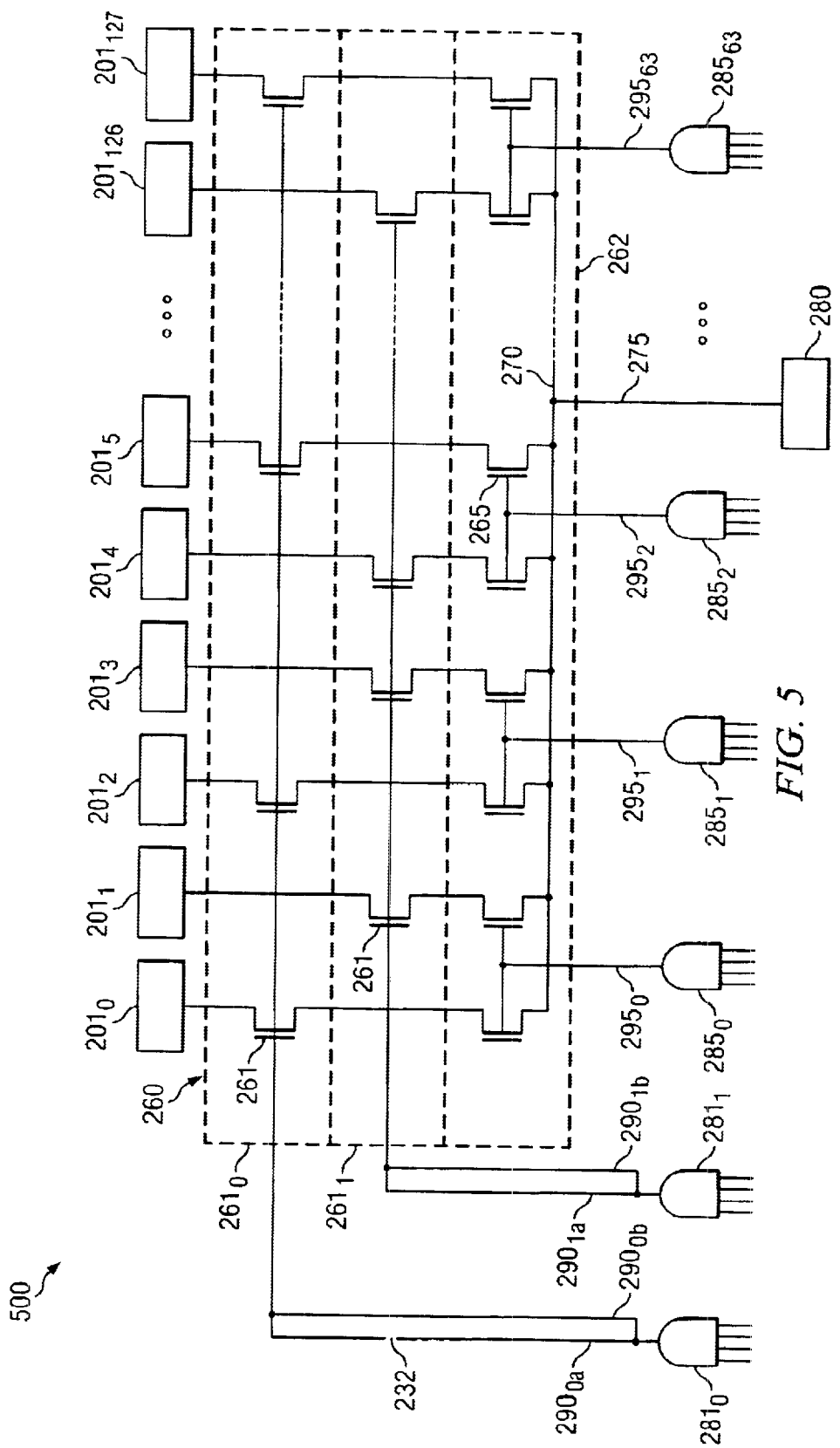
FIG. 5 shows a hierarchical column select architecture in accordance with one embodiment of the invention.

FIG. 5 shows a bank 500 of memory cells of a memory IC having a hierarchical column select architecture. The memory IC can include multiple banks of memory cells. Multi-bank memory ICs implemented an hierarchical column select architecture are described in, for example, U.S.

Pat. No. 5,822,268 which is herein incorporated by reference for all purposes. The memory bank includes a plurality of columns of memory cells 201, each comprising a bitline pair coupled to a SA.

A hierarchical column select switch 260 is coupled to the columns. The hierarchical column select switch includes first (bank) and second (global) switches 261 and 262. The switches, for example, comprise transistors. The bank switch receives bank column select signals from bank column select decoders 281 via BCSLs 290; the global switch receives global column select signals from global column decoders 285 via GCSLs 295. Typically, GCSLs are shared with other banks of the memory IC while the BCSLs are unique to each bank. In operation, the bank switch selects a group of columns within the bank and the global switch selects one column from the selected group of columns for sensing by a SSA 280 coupled to a MDO 275.

In an exemplary embodiment, the bank comprises 128 columns $201_0$–$201_{127}$. First and second BCSLs $290_0$ and $290_1$ controls first and second bank switches $261_0$ and $261_1$, respectively the bank switches divide the bank into 2 groups of 64 columns. When a bank switch is activated, its respective group of columns is selected. Sixty-four GCSLs $295_0$–$295_{63}$ are provided to the global column switch to select one column from the selected group of 64 columns.

In accordance with the invention, the BCSLs 290 are provided with redundant conductive paths. In one embodiment, at least first and second conductive paths (denoted by subscript a and b) are provided between a bank column decoder 281 and a bank column switch 261. In the case where a conductive path is defective (e.g., open connection 232 in conductive line $290_{0a}$), the other conductive path (e.g., $290_{0b}$), serves as a redundant path to provide the necessary connection between the column select switch and the decoder. In an alternative embodiment, the first and second conductive paths can include at least one coupling point, as described in FIG. 4. Providing redundant conductive paths for GCSLs is also useful.

Figure 6:
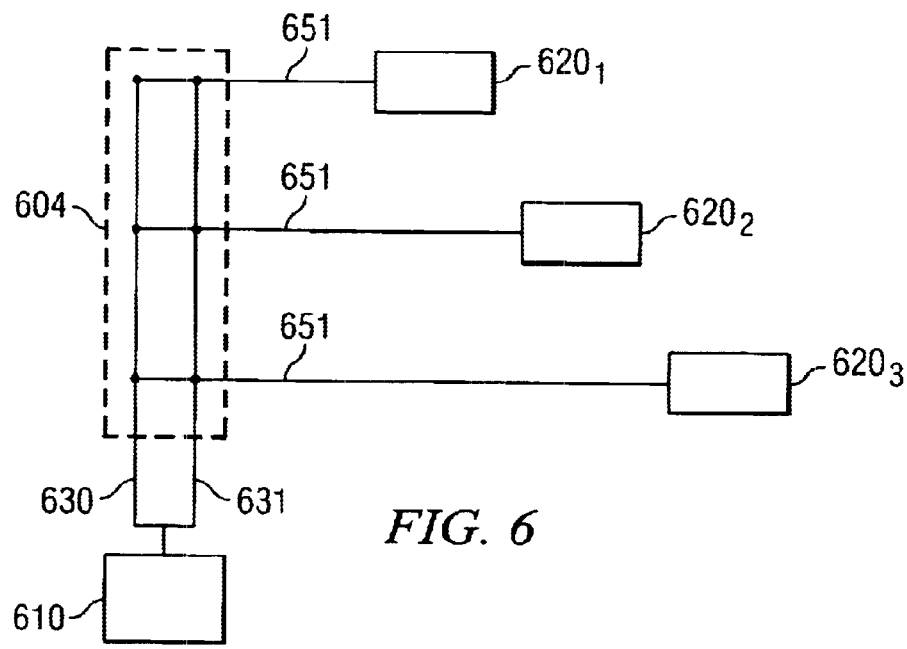
FIG. 6 shows an alternative redundancy technique.

FIG. 6 shows an alternative embodiment of the invention for repairing defective conductive lines in an IC. A circuit element 610 is coupled to a plurality of logic blocks $620_{1-3}$. The circuit element, for example, comprises a driver circuit which generates an output signal which is provided to the plurality of logic blocks. In one embodiment, the circuit element comprises at least first and second conductive lines 630 and 631 coupled to the output thereof. The logic blocks, each comprises a conductive line 651 coupled to its input. In one embodiment, the conductive lines 651 are coupled to the first and second conductive lines 630 and 631, forming a lattice redundancy structure 604. Providing a lattice redundancy structure divides the signal path into a plurality of segments, coupling the circuit element and the logic blocks. This enables the circuit portion to still operate with multiple defects in the conductive path between the circuit element and logic blocks.

Figure 7B:
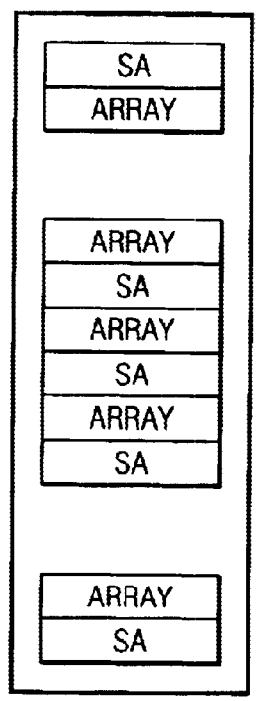
FIGS. 7a and 7b, collectively
Figure 7A:
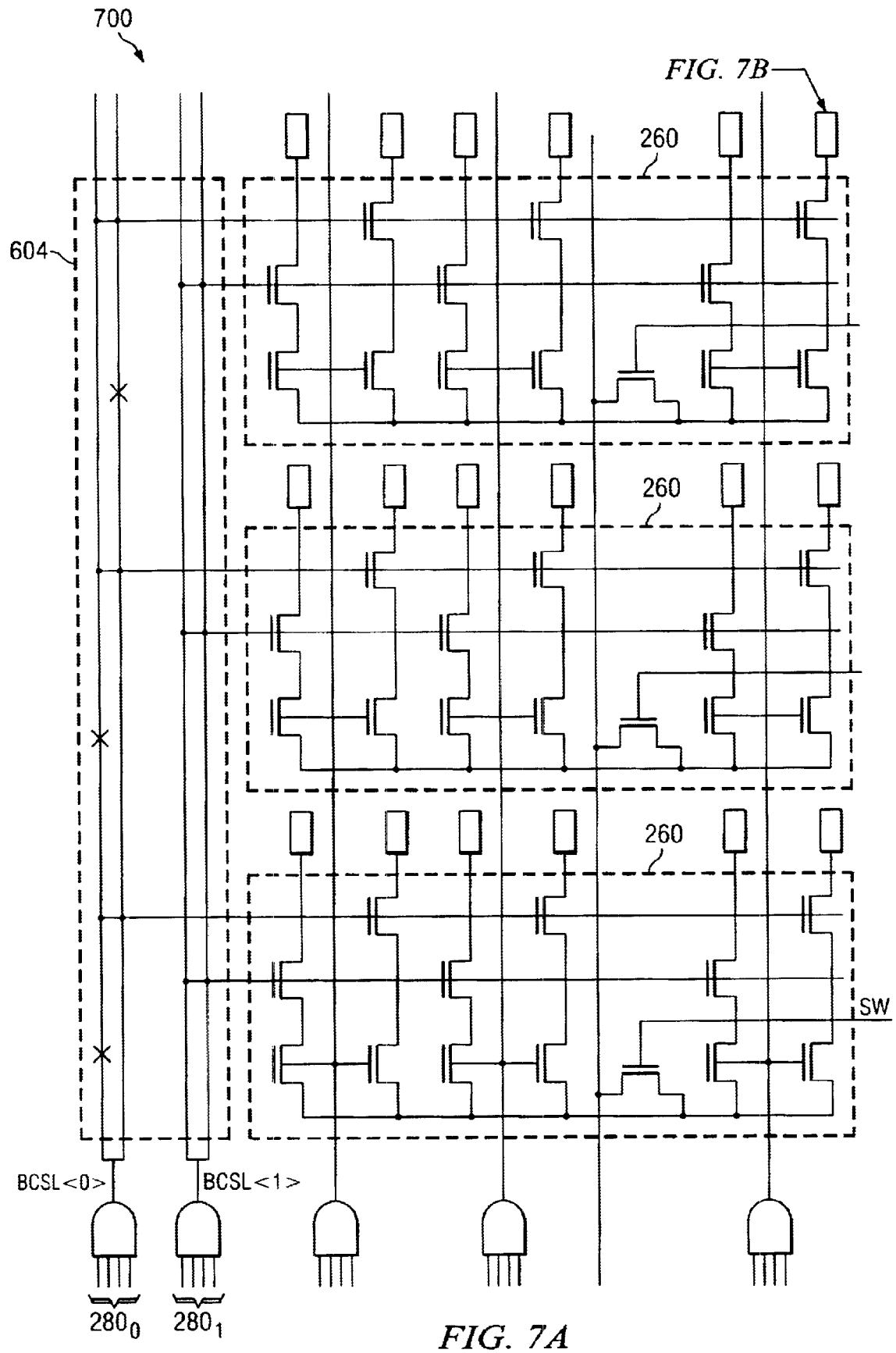

The lattice redundancy structure 604 is particularly useful, for example, for BCSL signal lines in a hierarchical column select architecture 700, as shown in FIG. 7. The lattice redundancy structure provided multiple segments in the overall conductive path between the BCSL select circuits $281_0$ and $281_1$ and the hierarchical column select switch 260. As shown, multiple defects (e.g., 3), as indicated by the symbol x, can occur in the overall conductive path without impacting the electrical connection between BCSL select circuit $281_0$ and the hierarchical column select switches.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit comprising:
   a first element including a node;
   a second element including a second node;
   a first metal line coupled between the first node of the first element and the second node of the second element;
   a second metal line coupled between the first node of the first element and the second node of the second element; and
   wherein the first metal line and the second metal line both provide an electrical connection between the first node of the first element and the second node of the second element.

2. The integrated circuit of claim 1 and further comprising a conductive line coupled between the first and second paths metal lines.

3. The integrated circuit of claim 1 and further comprising a plurality of conductive lines coupled between the first and second paths metal lines.

4. The integrated circuit of claim 1 wherein the integrated circuit comprises a memory device.

5. The integrated circuit of claim 4 wherein the first element includes a plurality of memory devices and wherein the second element includes a decoder and wherein the first and second metal lines are provided to carry a select signal from the second element to the first element.

6. The integrated circuit of claim 5 wherein the select signal comprises a column select signal.

7. A memory device comprising:
   a plurality of memory cells arranged in rows and columns;
   a decoder circuit;
   a data line;
   a selection device having a current path coupled between the plurality of memory cells and the data line, the selection device having a control node;
   a first conductive line coupled between an output or the decoder circuit and the control node of the selection device; and
   a second conductive line coupled between the output of the decoder circuit and the control node of the selection device.

8. The device of claim 7 wherein the plurality of memory cells comprises a plurality of dynamic random access memory cells.

9. The device of claim 8 and further comprising a sense amplifier coupled between the plurality of memory cells and the selection device.

10. The device of claim 9 and further comprising a secondary sense amplifier coupled to the data line.

11. The device of claim 7 wherein the plurality of memory cells comprises a bank of memory cells, wherein the selection device comprises a bank switch, wherein the decoder comprises a bank column select decoder.

12. The device of claim 7 and further comprising a second selection device, a third selection device and a fourth selection device, wherein each of the selection devices includes a control node coupled to both the first conductive line and the second conductive line.

13. The device of claim 7 wherein the first conductive line comprises a copper line and wherein the second conductive line comprises a copper line.

14. The device of claim 7 wherein the first conductive line comprises an aluminum line and wherein the second conductive line comprises an aluminum line.

15. The device of claim 7 and further comprising a plurality of coupling points coupled between the first conductive line and the second conductive line.

16. The device of claim 7 wherein the first and second conductive lines form a portion of a lattice redundancy structure between the decoder circuit and the plurality of memory cells.

17. An integrated circuit comprising:
a first element including a first node and a second node;
a second element including a first node and a second node;
a first metal line coupled between the first node of the first element and the first node of the second element;
a second metal line coupled between the first node of the first element and the first node of the second element;
a third metal line coupled between the second node of the first element and the second node of the second element; and
a fourth metal line coupled between the second node of the first element and the second node of the second element.

18. The integrated circuit of claim 17 wherein the integrated circuit comprises a memory device.

19. The integrated circuit of claim 18 wherein the first element includes a memory array and wherein the second element includes a decoder and wherein the first and second metal lines are provided to carry a first select signal from the decoder to the memory array and wherein the third and fourth metal lines are provided to carry a second select signal from the decoder to the memory array.

20. The integrated circuit of claim 19 wherein the first node of the first element comprises a gate of a first column select transistor, wherein the second node of the first element comprises a gate of a second column select transistor, wherein the first node of the second element comprises a first output of a column decoder, and wherein the second node of the second element comprises a second output of the column decoder.

21. The integrated circuit of 20 wherein the first metal line and the second metal lines each comprise a copper line.

22. The integrated circuit of claim 17 and further comprising a conductive line coupled between the first metal line and the second metal line.

23. The integrated circuit of claim 21 and further comprising a plurality of conductive lines coupled between the first metal line and the second metal line.

* * * * *

UNITED STATES PATENT AND TRADEMARK OFFICE
CERTIFICATE OF CORRECTION

PATENT NO. : 6,680,857 B2
DATED : January 20, 2004
INVENTOR(S) : Mueller et al.

It is certified that error appears in the above-identified patent and that said Letters Patent is hereby corrected as shown below:

Column 1,
Line 55, "cost" should read -- cost. --.

Column 2,
Line 8, "shows" should read -- show --.
Line 66, "an" should read -- in --.

Column 3,
Line 47, "comprises" should read -- comprise --.

Column 4,
Line 9, "a node" should read -- a first node --.
Lines 21 and 25, remove the word "paths".
Line 42, "or" should read -- of --.

Column 6,
Line 18, "lines" should read -- line --.

Signed and Sealed this

Fourth Day of May, 2004

JON W. DUDAS
*Acting Director of the United States Patent and Trademark Office*